(12) United States Patent
Shao et al.

(10) Patent No.: US 10,996,044 B2
(45) Date of Patent: May 4, 2021

(54) MEASUREMENT METHOD FOR AVIATION-SPECIFIC PROXIMITY SENSOR

(76) Inventors: Zhibiao Shao, Xi'an (CN); Yixin Guo, Xi'an (CN)

( * ) Notice: Subject to any disclaimer, the term of this patent is extended or adjusted under 35 U.S.C. 154(b) by 477 days.

(21) Appl. No.: 14/386,817

(22) PCT Filed: Mar. 22, 2012

(86) PCT No.: PCT/CN2012/072799
§ 371 (c)(1),
(2), (4) Date: Sep. 22, 2014

(87) PCT Pub. No.: WO2013/139021
PCT Pub. Date: Sep. 26, 2013

(65) Prior Publication Data
US 2015/0051857 A1    Feb. 19, 2015

(51) Int. Cl.
*G01B 7/00* (2006.01)
*G01R 27/26* (2006.01)
*G01D 5/243* (2006.01)

(52) U.S. Cl.
CPC ............. *G01B 7/003* (2013.01); *G01D 5/243* (2013.01); *G01R 27/2611* (2013.01)

(58) Field of Classification Search
CPC .......... G01B 7/003; G01B 7/02; G01D 5/243; G01D 5/202; G01R 27/2611; H03K 17/945; H02M 3/157
(Continued)

(56) References Cited

U.S. PATENT DOCUMENTS

| 4,219,740 A | * | 8/1980 | Little | ................ H03K 17/9512 |
| | | | | 307/116 |
| 6,397,156 B1 | * | 5/2002 | Bachmann | ............... H02H 3/40 |
| | | | | 702/59 |

(Continued)

FOREIGN PATENT DOCUMENTS

| CN | 102135410 | * | 7/2011 |
| CN | 102620638 | * | 8/2012 |

(Continued)

OTHER PUBLICATIONS

Definition of Ergodic, Meriam Webster Dictionary, 2019. (Year: 2019).*

*Primary Examiner* — Michael P Nghiem

(57) ABSTRACT

A measurement method for an aviation-specific inductive proximity sensor (IPS for short) includes steps of: 1) building a measurement circuit, wherein an IPS comprises an internal resistance r and an inductance L; 2) building a look-up table, wherein the step 2) specifically comprises steps of: sampling a first voltage measured value $U_1$ corresponding to a first constant delay time $T_1$ with the ADC; sampling a second voltage measured value $U_2$ corresponding to a second constant delay time $T_2$ with the ADC; then obtaining voltage discharge formulas $U_1(T_1, R, r, L)$ and $U_2(T_2, R, r, L)$ of an r-L circuit; and 3) compressing the look-up table, utilizing the compressed look-up table for calculation during measurement. The present invention ensures that the system works within a standard temperature range, and improves measurement stability, reliability, and real-time performance. Furthermore, there is no floating point calculation, which saves CPU or MCU hardware resources.

3 Claims, 15 Drawing Sheets

(58) Field of Classification Search
USPC .......................................................... 702/65
See application file for complete search history.

(56) References Cited

U.S. PATENT DOCUMENTS

2011/0101967 A1* 5/2011 Kayserman ........ H03K 17/9535
324/207.15
2013/0138369 A1* 5/2013 Papana .............. G01R 31/3644
702/63

FOREIGN PATENT DOCUMENTS

JP 11030608 * 2/1999
WO WO-2013139021 A1 * 9/2013 ......... G01R 27/2611

* cited by examiner

MEASUREMENT METHOD FOR AVIATION-SPECIFIC PROXIMITY SENSOR

CROSS REFERENCE OF RELATED APPLICATION

This is a U.S. National Stage under 35 U.S.C. 371 of the International Application PCT/CN2012/072799, filed Mar. 22, 2012.

BACKGROUND OF THE PRESENT INVENTION

Field of Invention

The present invention belongs to a field of sensors, relates to driving and detection methods for a passive sensor, and more particularly to driving and detection methods for an aerospace inductive proximity sensor (IPS for short), and an optimization method for calculating inductance values by table look-up, which are in particular applicable to table compression of sampling and calculating a charge-discharge curve of an r-L circuit by table look-up.

Description of Related Arts

Because a non-contact IPS has higher reliability and mean time between failures (MTBF for short) than a mechanical displacement switch, the non-contact IPS is increasingly frequently used in aviation electromechanical systems such as various types of aircraft landing gears, passenger and cargo doors, flaps, thrust reversers, etc. Aircraft types involved are large civil aircrafts, transport aircrafts and so on.

Industrial non-contact IPS is usually active, bulky, with thick winding wires, driven by high current for detecting, used for outputting digital switching signals, and relatively easy to use. However, high current driving and controlling methods of the sensor cannot meet the general electromagnetic compatibility standards in aviation field. Therefore, the industrial sensor is not suitable for the field of aviation.

Conventionally, main parts of the aviation non-contact IPS are mainly provided by two companies, namely Crane (USA) and Crouzet (France). Internal structures and principles thereof are the same, and main parameters thereof are similar. The sensor is passive, and an internal circuit structure thereof is simple, which comprises a group of winding coils. Shown in FIG. 1, an equivalent circuit model of the IPS comprises a real part of resistor r and an inductor L in series. An inductance value and current capability of the coil are much smaller than the industrial sensor. Typically, a maximum inductance value is no more than 10 mH; and the current capability of the coil is no more than 20 mA.

Conventionally, there are two main driving and detection methods for the passive non-contact IPS: analog measurement method and digital measurement method.

The analog measurement method comprises steps of: applying pulse excitation to the sensor coil, comparing thresholds of the R-L discharge curve by a comparator for detecting the inductance value, then judging whether a nearby target is moving towards the sensor by comparing the inductance value. The analog measurement method is the most common one, and a circuit thereof is simple and reliable. However, due to a large temperature drift of the resistance inside the sensor, an operating temperature range of the measuring system is small. The contradiction of operating temperature and the measurement accuracy remains to be eliminated.

The digital measurement method typically comprises steps of: applying a sine wave excitation to the sensor circuit, sampling waveforms of voltage and current and applying fast Fourier transform (FFT for short) algorithm for obtaining a phase difference between the voltage and the current, and calculating the sensor inductance L. The temperature drift of the resistance inside the sensor is eliminated by calculating, so as to eliminate measurement errors caused by ambient temperature, and expand the operating temperature range. However, the digital measurement method is poor in stability, liable to be affected by external electromagnetic annoyance, and insufficient in real-time performance

SUMMARY OF THE PRESENT INVENTION

An object of the present invention is to provide an analog-digital mixed measurement method for an aviation-specific IPS to overcome the above disadvantages, wherein the measurement method keeps advantages of two conventional kinds of measurement methods: ensuring that a system works within a standard temperature range; improving measurement stability, reliability, and real-time performance; omitting floating point calculation, and saving CPU or MCU hardware resources. For accurately providing the above method, a specific calculation method for a 2-dimensional look-up table, an evaluation method for quantizing error of a look-up table method, and a method for greatly compressing the look-up table are designed according to the present invention.

Accordingly, in order to accomplish the above object, the present invention provides a measurement method for an aviation-specific IPS, comprising steps of:

1) building a measurement circuit, wherein a IPS comprises an internal resistance r and an inductance L, a value of the internal resistance r increases when environmental temperature increases, a value of the inductance L relates to a distance between the IPS and a metal target; the measurement circuit of the IPS comprises a current-limiting resistance R, the IPS and a controlled switch connected in series; an analog-digital converter (ADC for short) is placed at a voltage measurement node between the current-limiting resistance R and the internal resistance r;

2) building a look-up table, wherein the step 2) specifically comprises steps of: sampling a first voltage measured value $U_1$ corresponding to a first constant delay time $T_1$ with the ADC; sampling a second voltage measured value $U_2$ corresponding to a second constant delay time $T_2$ with the ADC; then obtaining voltage discharge formulas $U_1(T_1, R, r, L)$ and $U_2(T_2, R, r, L)$ of an r-L circuit, wherein $T_1$, $T_2$, and R are constants; uniting the two formulas for building the look-up table of the internal resistance r and the inductance L corresponding to the $U_1$ and $U_2$; and 3) compressing the look-up table, utilizing the compressed look-up table for measurement of the IPS: for example, in a 12-bit ADC, a size of a complete 2-dimensional look-up table is $2^{12} \times 2^{12}$, a storage volume thereof is 16M units. In view of practicability, an effective method for compressing the look-up table must be found for ensuring practicability of the present invention. By taking full advantage of a distribution characteristic of sample values [$U_1$, $U_2$] in a real circuit, the look-up table is able to be effectively compressed.

Preferably, in the step 2):

between the first constant delay time $T_1$ and the second constant delay time $T_2$, the controlled switch is on, the inductance L slowly discharges through internal and external resistances; at an initial time $T_0$, the controlled switch is off, then the inductance L is charged, and a current thereof is:

$$i = \frac{U_{max}}{R+r}\left[1 - e^{-\frac{R+r}{L}\times T}\right] \quad (1)$$

a voltage at the voltage measurement node is:

$$U = U_{max} - i \times R \quad (2)$$

therefore:

$$U = \frac{U_{max}}{R+r}\left[r + R \times e^{-\frac{R+r}{L}\times T}\right] \quad (3)$$

at the first constant delay time $T_1$ and the second constant delay time $T_2$ control the ADC to sample, and the corresponding $U_1$ and $U_2$ are:

$$\begin{cases} U_1 = \frac{U_{max}}{R+r}\left[r + R \times e^{-\frac{R+r}{L}\times T_1}\right] \\ U_2 = \frac{U_{max}}{R+r}\left[r + R \times e^{-\frac{R+r}{L}\times T_2}\right] \end{cases} \quad (4)$$

Preferably, the formula (4) is calculated by a least square method comprising steps of:
building an object function:

$$\min: (U_1 - U_1(L,r))^2 + (U_2 - U_2(L,r))^2$$

$$s.t.1: r > 0$$

$$s.t.2: L > 0 \quad (5)$$

further obtaining:

$$\min\left(U_1(R+r) - U_{max}\left(r + R \times e^{-\frac{R+r}{K}\times T_1}\right)\right)^2 + \quad (6)$$
$$\left(U_2(R+r) - U_{max}\left(r + R \times e^{-\frac{R+r}{L}\times T_2}\right)\right)^2$$

$$s.t.1: r > 0$$

$$s.t.2: L > 0$$

wherein a max voltage $U_{max}$ (namely $2^n - 1$, n is a resolution of the ADC), the current-limiting resistance R, the first constant delay time $T_1$ and the second constant delay time $T_2$ are constants;

it is proved that when applying each group of the sample values $[U_1, U_2]$ obtained at $T_1$ and $T_2$ to the formula (4), the formula (4) has only one solution $[L, r]$; with the formula (6), a numerical solution of the $[L, r]$ is able to be obtained;

and applying each of the sample values in the $[U_1, U_2]$ for respectively calculating and obtaining the numerical solution of the $[L, r]$ corresponding to the $[U_1, U_2]$, in such a manner that the look-up table is obtained.

Preferably, in the step 3):

For practicability, a restriction condition of a physical model of the measurement circuit, which is applied on the $[U_1, U_2]$, should be taken full advantage of, for compressing the look-up table. The above restriction condition comprises:

a) $T_1$ and $T_2$ are artificially determined, in such a manner that a restriction condition is $T_1 < T_2$; it is proved that U(T) is a monotone decreasing function, therefore, $U_1 > U_2$; and b) $[L, r]$ is a distribution parameter in a real physical model and must be a positive real number; it is provable that with restriction of the formula (1), mapping a positive real space of $[U_1, U_2]$ to a space of $[L, r]$ may cause negative numbers or even complex numbers in the $[L, r]$; however, such $[U_1, U_2]$ will not appear in practical sampling.

By removing points where $U_1 < U_2$, and the obtained $[L, r]$ comprises a negative number or complex number, the scale of the look-up table is able to be decreased.

By applying the $U_{max}$ and the sample values $(U_1, T_1)$ and $(U_2, T_2)$ to the formula (4) and calculating to obtain:

$$\begin{cases} L = -\frac{(R+r) \times T_1}{\log\left[\frac{U_1}{(2^n-1)R}(R+r) - \frac{r}{R}\right]} \\ L = -\frac{(R+r) \times T_2}{\log\left[\frac{U_2}{(2^n-1)R}(R+r) - \frac{r}{R}\right]} \end{cases} \quad (7)$$

then obtaining $$\left[\frac{U_1}{(2^n-1)R}(R+r) - \frac{r}{R}\right]^{\left(\frac{T_2}{T_1}\right)} = \left[\frac{U_2}{(2^n-1)R}(R+r) - \frac{r}{R}\right] \quad (8)$$

wherein R and r are positive real numbers, and $T_1 < T_2$; if the solution $[L, r]$ is a positive real number, then a restriction condition is:

$$1 > \left[\frac{U_1}{(2^n-1)R}(R+r) - \frac{r}{R}\right] > \left[\frac{U_2}{(2^n-1)R}(R+r) - \frac{r}{R}\right] > 0 \quad (9)$$

which means:

$$(2^n - 1) > U_1 > U_2 > \frac{(2^n-1)r}{R+r}. \quad (10)$$

According to the above restriction condition, a range of the $[U_1, U_2]$ is determined by an ergodic method, wherein:

in practice, r is a distributed resistance in a wire which increases when the environment temperature increases, a min acceptable value $r_{min}$ is applied to the formula (10) for determining the sample value $U_1$ and a possible min value $U_{1min}$;

applying the $U_{1min}$ to the formula (8) to obtain:

$$U_{2min} = \frac{\left[\frac{U_{1min}}{(2^n-1)R}(R+r) - \frac{r}{R}\right]^{\left(\frac{T_2}{T_1}\right)} + \frac{r}{R}}{(R+r)} \times (2^n - 1)R \quad (11)$$

regarding the formula (11) as a function of $U_{2min}$ referring to r, calculating a range of the $U_{2min}$ within a range of the distributed resistance r;

wherein the $[U_1, U_2]$ are positive integers sampled by the ADC; ranges of the $U_2$ respectively corresponding to $U_{1min}$, $U_{1min}+1$, $U_{1min}+2$, $U_{1min}+3$ ... $U_{1min}+(2^n-1)$ are obtained in sequence by repeating the above method, and a set thereof forms a definition domain of the look-up table;

and applying points in the definition domain of the look-up table to the formula (6) for calculating the corresponding solutions $[L, r]$, so as to obtain the compressed look-up table. Points out of the definition domain will not be obtained in the practical sampling, and do not need to be recorded.

By mathematical analysis of the formula (11), it is concluded that:

after the $T_1$ and $T_2$ are determined, a scale of the compressed look-up table is mainly depended on a value of a divider resistance R and a change value of the distributed resistance r within an effective working range of the system.

In practice, a measured object is an induction formed by a winding metal wire, a range of a distributed resistance r thereof is large due to a large temperature drift coefficient, which is unfavorable for compression of the look-up table. Usually, a value of the r is not too high. Therefore, by utilizing divider resistance R with high accuracy, low temperature drift, and a range much larger than the range of the r, a sufficient compression ratio of the look-up table is able to be obtained. Referring to a preferred embodiment, specific values thereof are illustrated.

The present invention is applicable to aviation systems such as landing gears, passenger and cargo doors, flaps, and thrust reversers. With gradual opening of aviation markets, the present invention has a wide application range, great economic benefit and social benefit. Compared with the conventional technologies and products, the present invention has technical advantages, improves MTBF, and increases market share of the IPS products and secondary developed products thereof. At the same time, multi-dimensional look-up table compression method is able to effectively reduce size and cost of related control detection systems, and improve system stability, so as to provide extensive application prospect, economic benefit and social benefit.

These and other objectives, features, and advantages of the present invention will become apparent from the following detailed description, the accompanying drawings, and the appended claims.

DETAILED DESCRIPTION OF THE PREFERRED EMBODIMENT

Figure 1:
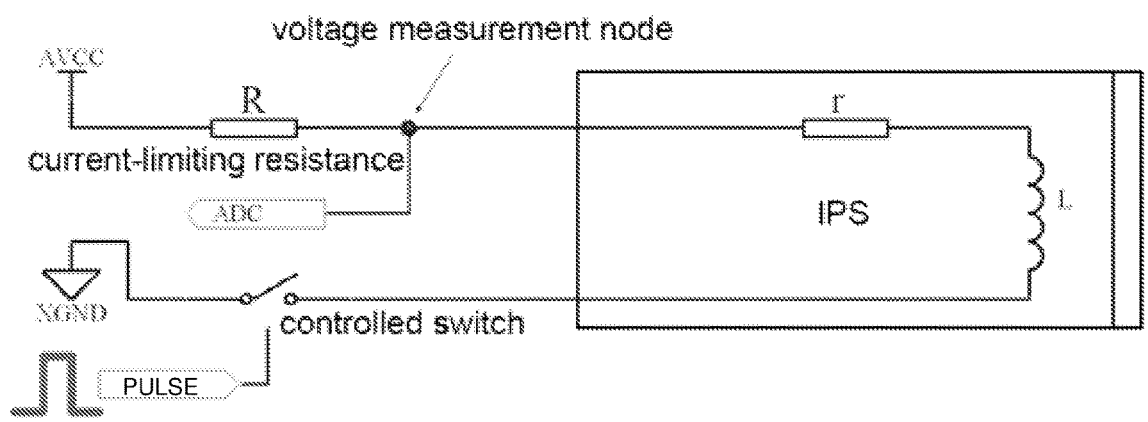
FIG. 1 shows a schematic view of an equivalent circuit model of an IPS according to a preferred embodiment of the present invention.

Referring to the drawings, the present invention is further illustrated.

According to the present invention, an internal circuit structure of an IPS is simple, which is formed by a group of metal winding wires. Referring to the FIG. 1, an equivalent circuit model thereof is formed by an internal resistance r in an induction coil and an inductance L connected in series (a parasitic capacitance is ignored). The internal resistance r increases when environmental temperature increases, and a value of the inductance L relates to a distance between the IPS and a metal target. If an external metal target is moving towards the IPS, electromagnetic field distribution around the IPS is greatly changed, and an equivalent induction of the IPS is increased. By driving and detecting an induction value, whether the external metal target is moving towards the IPS is able to be judged.

For example, an induction value of a product of Crouzet changes from 4.5 mH (far) to 5.5 mH (close), which rarely changes with a temperature. A resistance thereof changes with a temperature, and a reference range is 10Ω to 15Ω, which rarely changes with a proximity By driving the IPS and detecting an inductive reactance of the induction, the proximity is able to be detected.

Accordingly, driving and detecting methods require:

1) a peak of a driving current is no more than 15 mA, wherein a higher current is not able to pass an electromagnetic compatibility test; the peak is no less than 10 mA, a lower current is liable to be interfered by an external electromagnetic environment; and 2) a inductance change rate is 2%; a quantified measurement index of 5% is required; inductance detection accuracy of the system should be 0.1%; and 3) as the change rate of the internal resistance within a standard temperature range is over 60%, an impact of temperature drift on inductance detection must be considered; and 4) for improving system MTBF, hardware resources such as CPU, MCU and DSP are not utilized.

Figure 2:
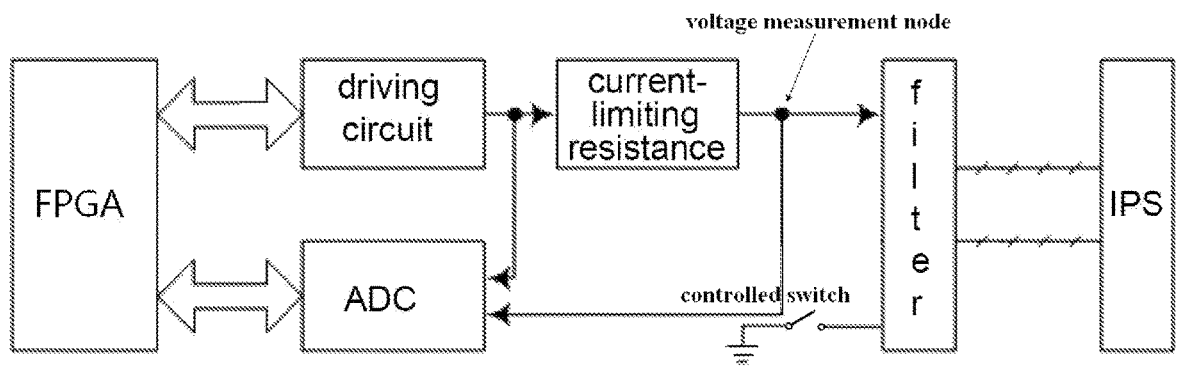
FIG. 2 shows a schematic view of a driving and detection module of the IPS according to the preferred embodiment of the present invention.
Figure 3:
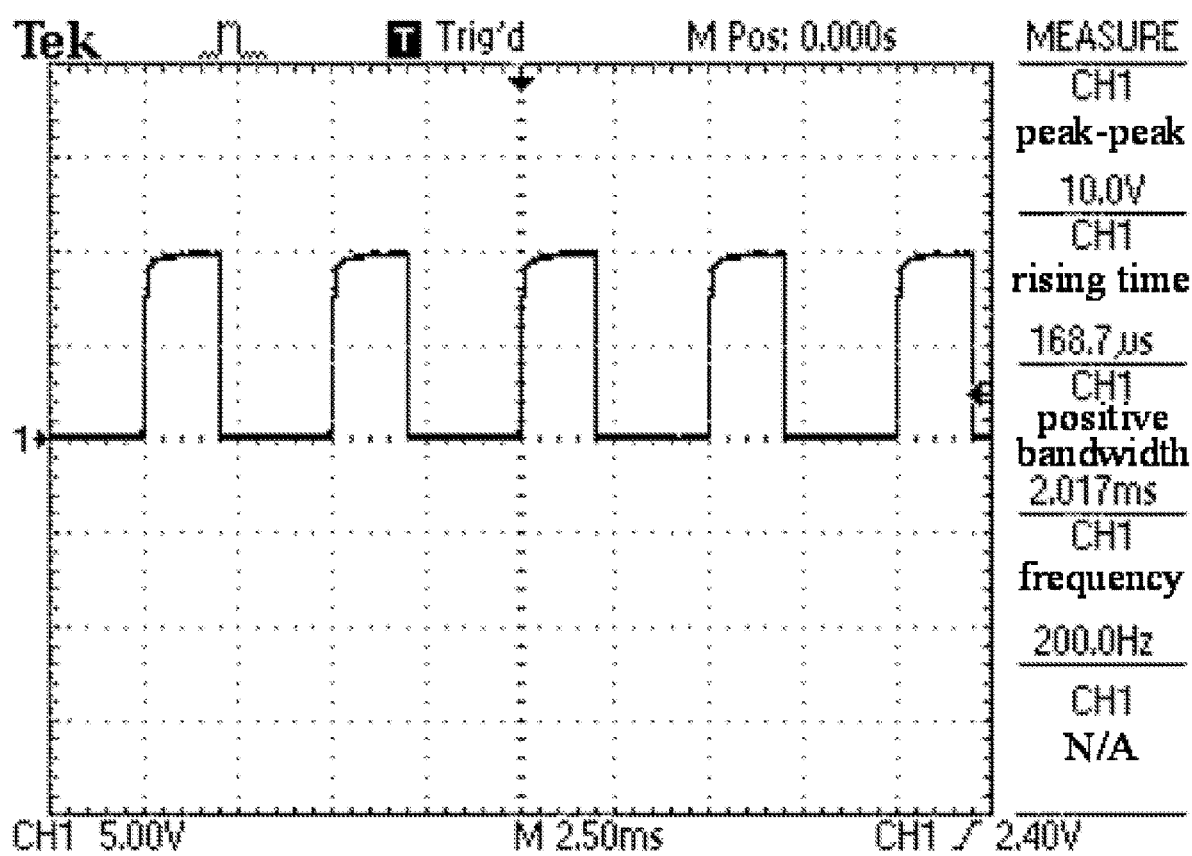
FIG. 3 shows a waveform of a circuit output signal of the IPS according to the preferred embodiment of the present invention.

Referring to the FIG. 2, FPGA controlling and driving circuit outputs a 0~5V pulsing signal. A drive circuit outputs a driving signal with an amplitude of 0~5V, a positive bandwidth of 2 ms and a period of 200 Hz. Referring to the FIG. 3, a waveform of the drive circuit output signal is illustrated, wherein the output signal passes through a divider circuit, a filter and a sensor, and grounds through the filter.

Figure 4:
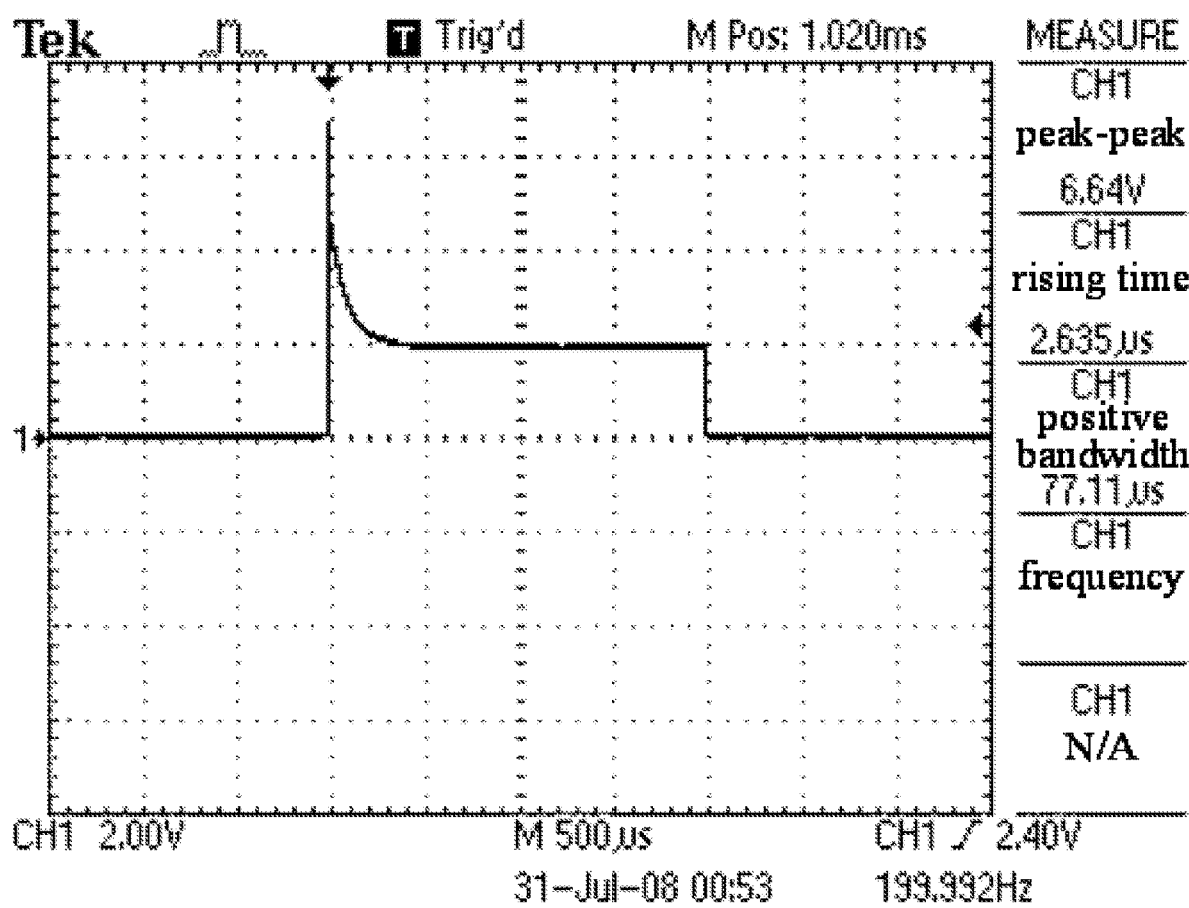
FIG. 4 shows a response waveform of the IPS which is close to a target according to the preferred embodiment of the present invention.
Figure 5:
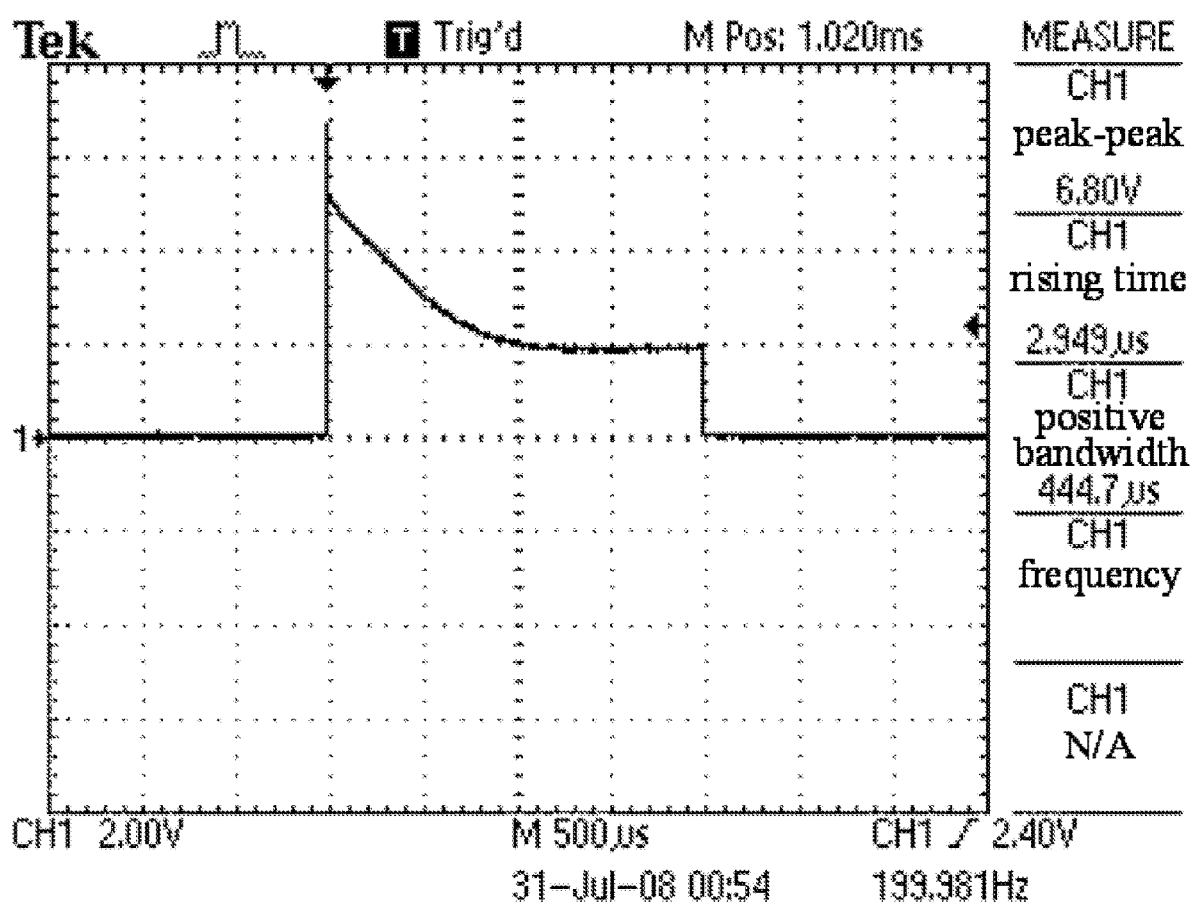
FIG. 5 shows a response waveform of the IPS which is far from the target according to the preferred embodiment of the present invention.
Figure 6:
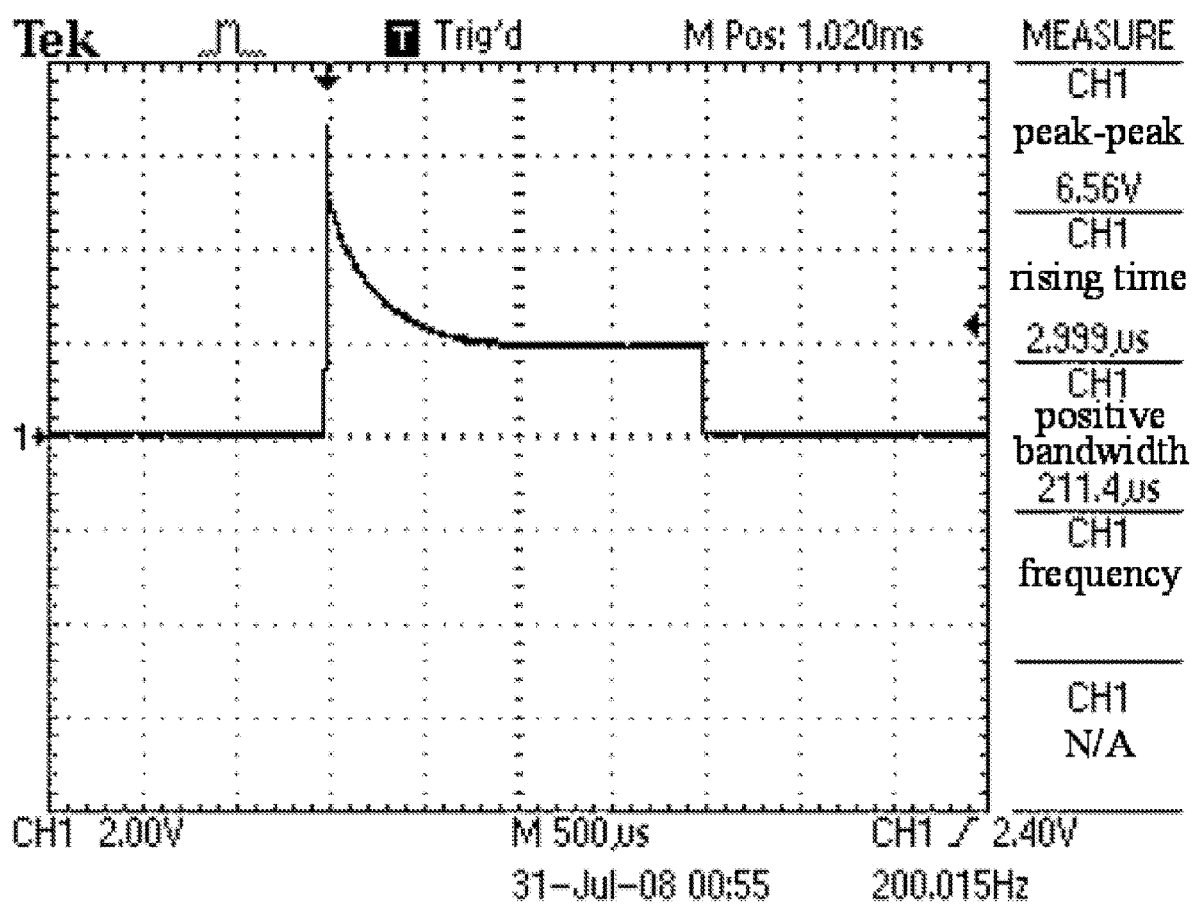
FIG. 6 shows a response waveform of the IPS which is 1 mm~2 mm far from the target according to the preferred embodiment of the present invention.

If the IPS is close to a target, a waveform detected at a measurement node is as illustrated in the FIG. 4. If the IPS is far from a target, a waveform detected at the measurement node is as illustrated in the FIG. 5. If the IPS is 1 mm~2 mm far from a target, a waveform detected at the measurement node is as illustrated in the FIG. 6.

Two constant delay times are obtained by an ADC for sampling voltage measured values $U_1$ and $U_2$ corresponding to the constant delay times $T_1$ and $T_2$, and further obtaining two voltage discharge formulas $U_1(T_1, R, r, L)$ and $U_2(T_2, R, r, L)$ of an r-L circuit, wherein $T_1$, $T_2$, and R (limiting resistance) are constants; the two formulas are united for solving the internal resistance r and the inductance L.

For building the formulas:

Referring to the FIG. 1, between two measurements, a controlled switch is on, the inductance L slowly discharges through internal and external resistances; at a time $T_0$, the controlled switch is off, then the inductance L is charged, and a current thereof is:

$$i = \frac{U_{max}}{R+r}\left[1 - e^{-\frac{R+r}{L} \times T}\right] \quad (1)$$

a voltage at the voltage measurement node is:

$$U = U_{max} - i \times R \quad (2)$$

therefore:

$$U = \frac{U_{max}}{R+r}\left[r + R \times e^{-\frac{R+r}{L} \times T}\right] \quad (3)$$

the first constant delay time $T_1$ and the second constant delay time $T_2$ control the ADC to sample, and the corresponding $U_1$ and $U_2$ are:

$$\begin{cases} U_1 = \frac{U_{max}}{R+r}\left[r + R \times e^{-\frac{R+r}{L} \times T_1}\right] \\ U_2 = \frac{U_{max}}{R+r}\left[r + R \times e^{-\frac{R+r}{L} \times T_2}\right] \end{cases} \quad (4)$$

Parameters:

A range of the inductance L is [4.5, 5.5] mH; a range of the internal resistance r is [10, 15]Ω.

$U_1$ and $U_2$ are represented by values sampled by a 12-bit ADC, wherein $U_{max}$ is 4095.

According to a current-limiting condition, the limiting resistance R is 230Ω.

Figure 7:
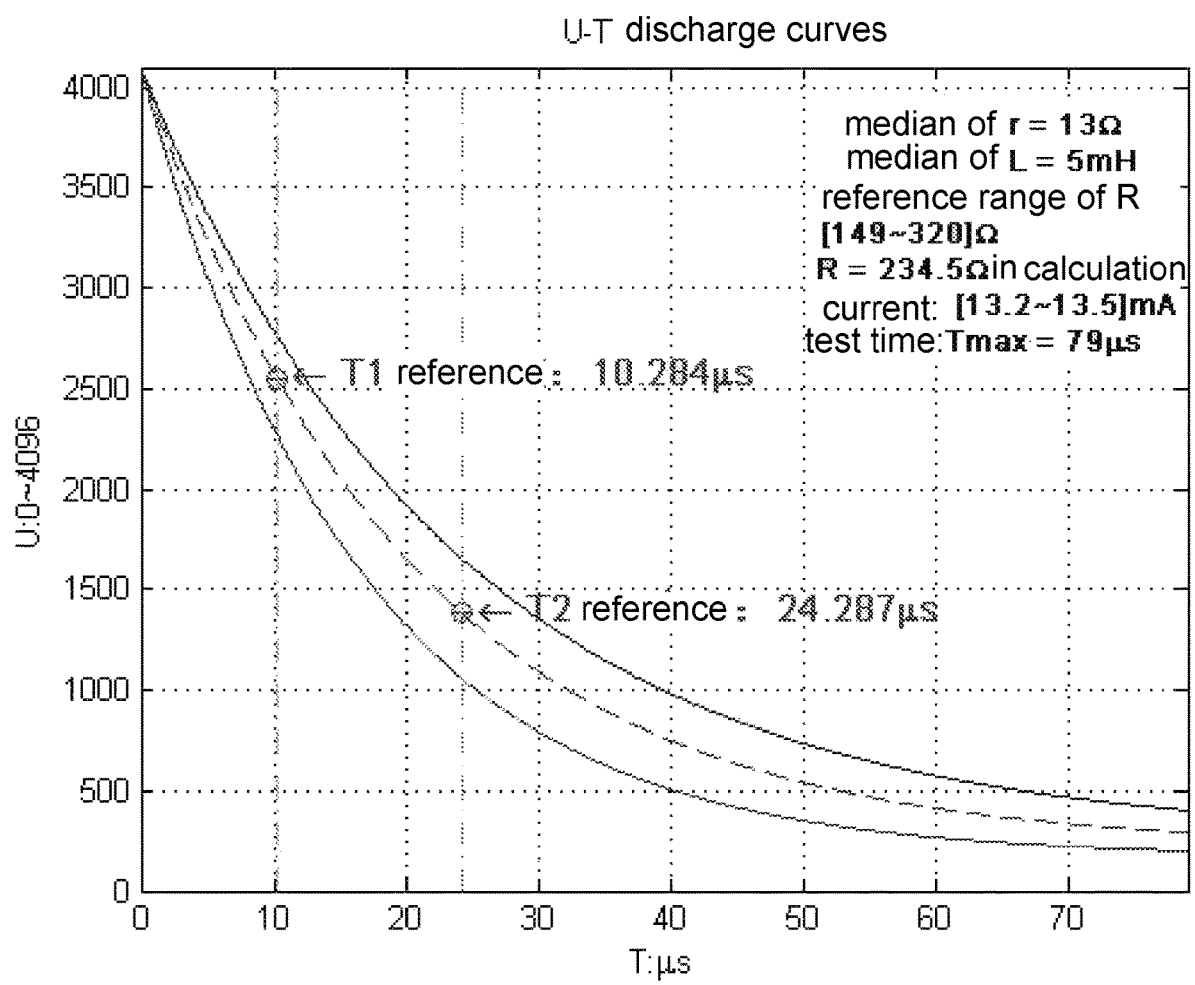
FIG. 7 shows a discharge curve according to the preferred embodiment of the present invention.

Referring to the FIG. 7, medians of the ranges of the internal resistance r and the inductance L are selected for forming a discharge curve. At a time $T_1$, the inductance L discharges to 30%. At a time $T_2$, the inductance L discharges to 60%. $T_1$ is 10.284 μs, $T_2$ is 24.287 μs.

It is provable that the formula (4) has only on solution: after quantifying by the ADC:

$$U(R, T, r, L) = \frac{4095}{R+r}\left[r + R \times e^{-1\frac{R+r}{L} \times T}\right] \quad (5)$$

U(R, T, r, L) is a monotone decreasing function about R and T, and also a monotone increasing function about r and L.

Because U(R, T, r, L) is monotonic continuous function, an inverse function thereof exists, and the formula (4) has solutions.

Figure 8:
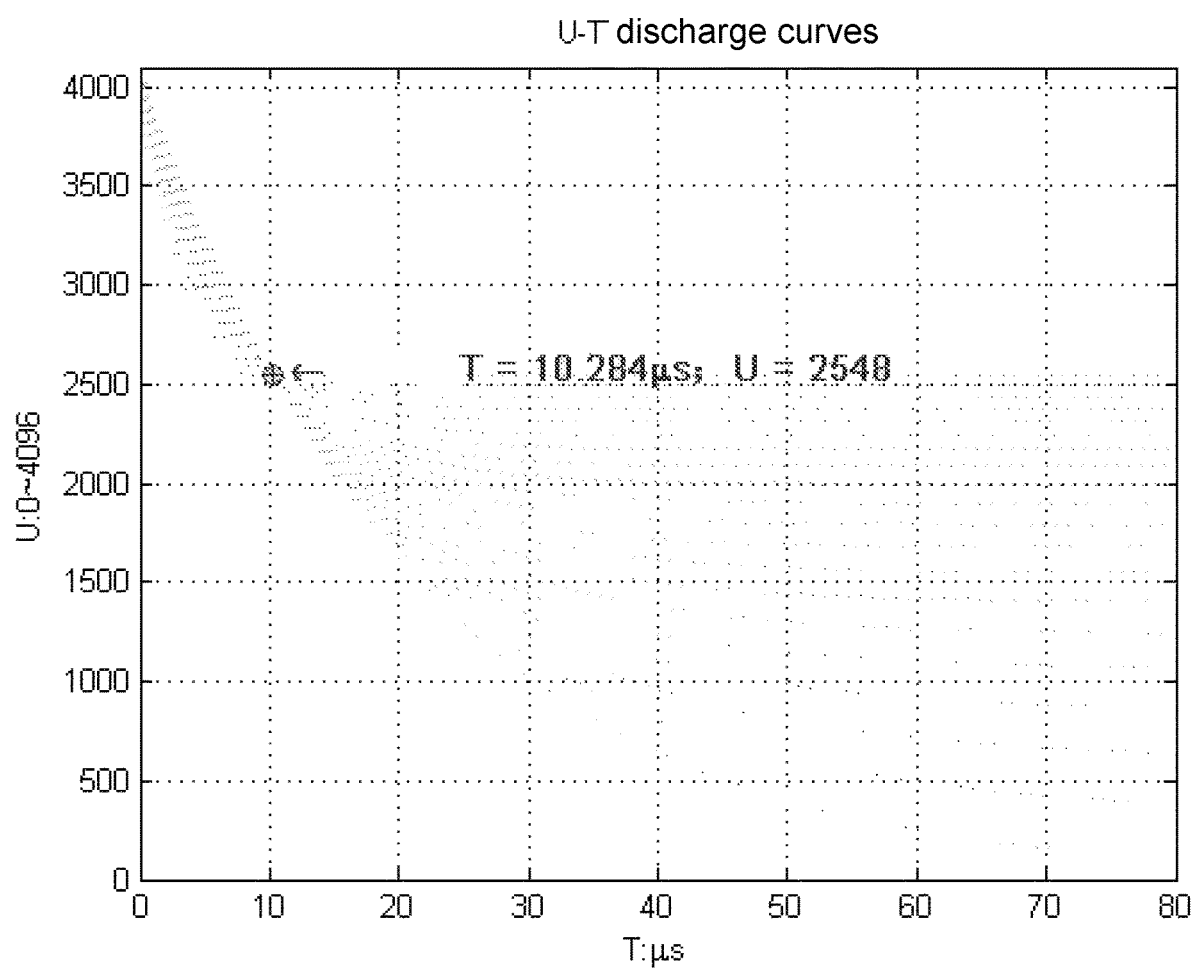
FIG. 8 shows a cluster of curves passing ($U_1$, $T_1$) according to the preferred embodiment of the present invention.

With given ($U_1$, $T_1$), the formula (4) is restricted by r and L. A space p is defined as a set of ($r_p$, $L_p$) which enables the function U-T to pass ($U_1$, $T_1$), as illustrated in the FIG. 8.

Figure 9:
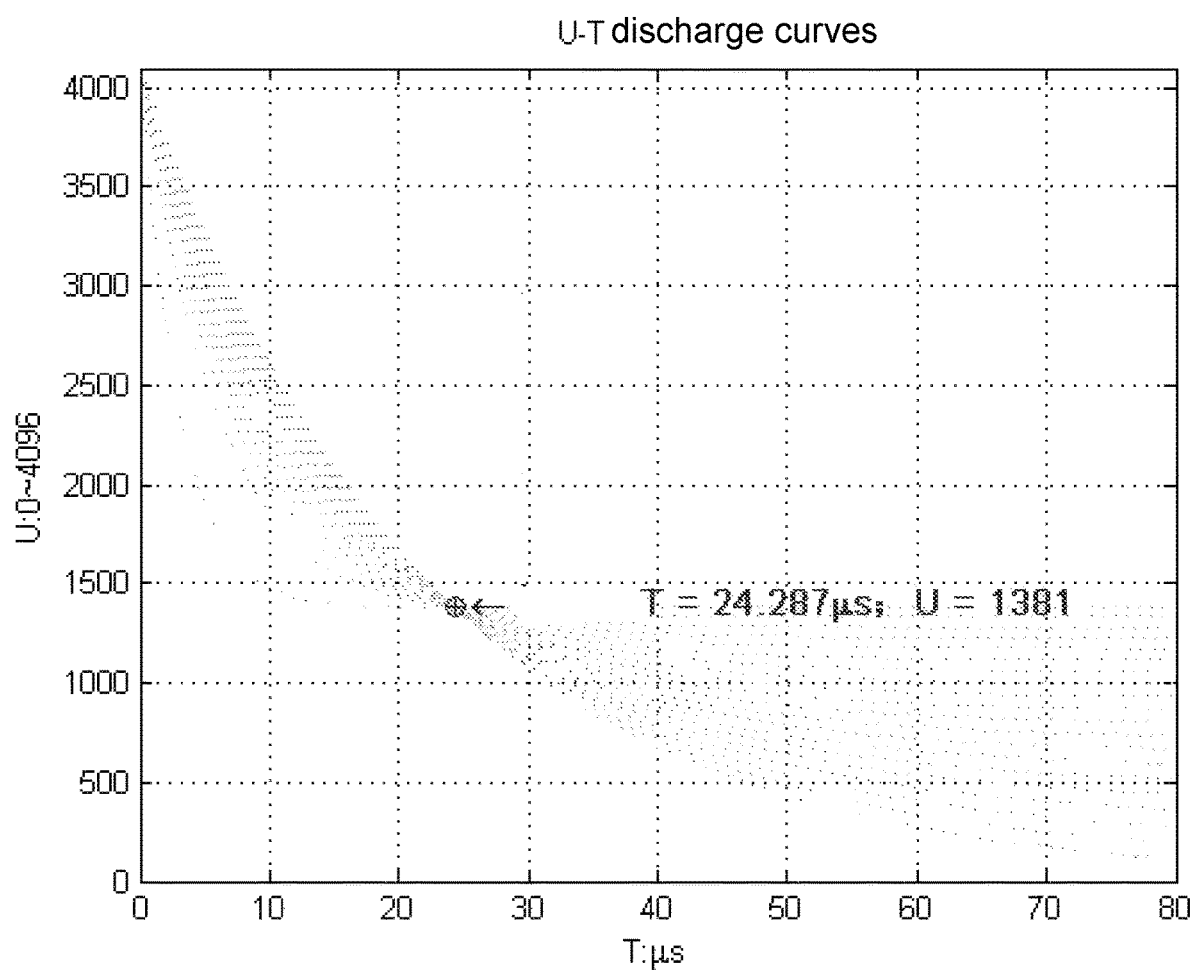
FIG. 9 shows a cluster of curves passing ($U_2$, $T_2$) according to the preferred embodiment of the present invention.

A space q is defined as a set of ($r_q$, $L_q$) which enables the function U-T to pass ($U_2$, $T_2$), as illustrated in the FIG. 9.

Figure 10:
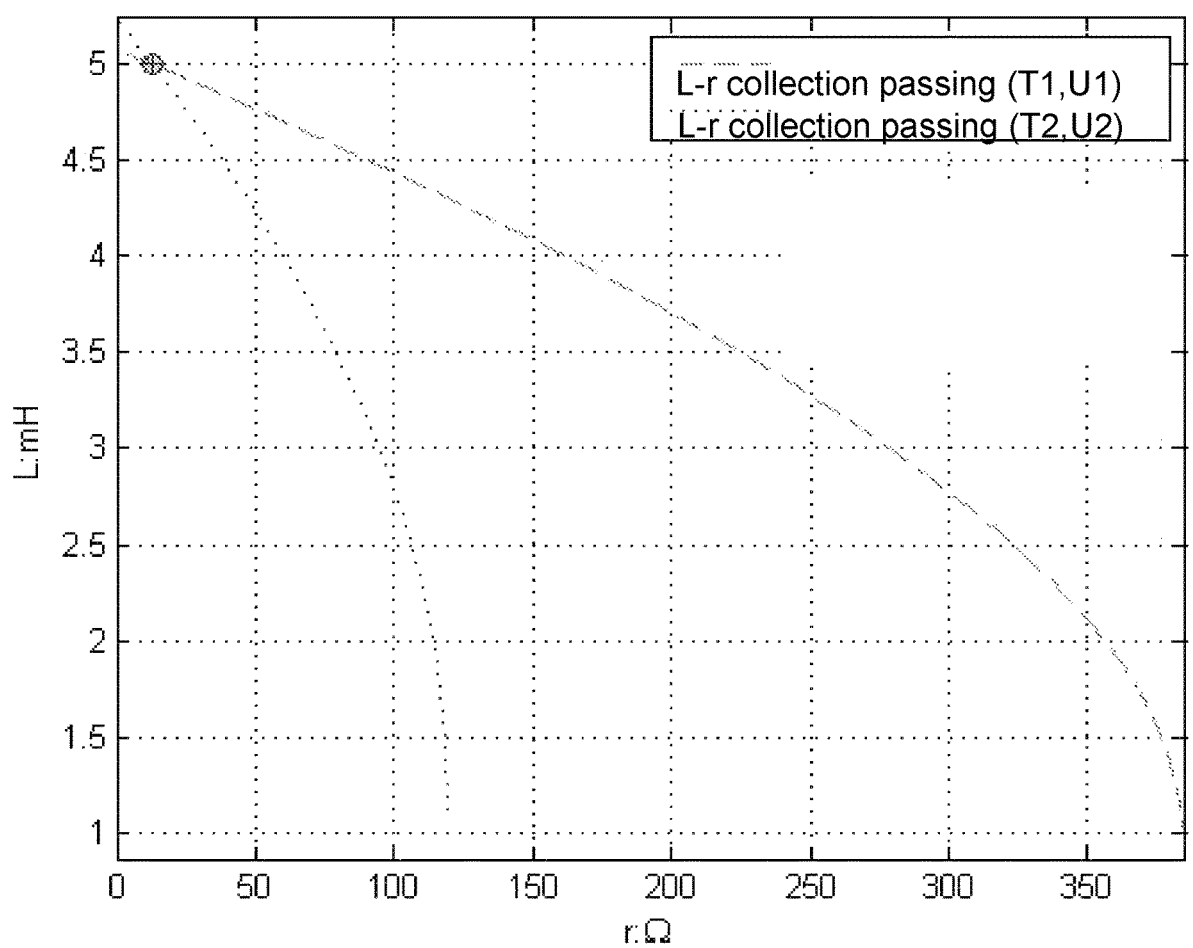
FIG. 10 shows a restriction condition of r-L according to the preferred embodiment of the present invention.

The spaces p and q are drawn in an r-L coordinate, as illustrated in the FIG. 10. The U-T curve corresponding to a crossover point of two curves in the FIG. 10 passes ($U_1$, $T_1$) and ($U_2$, $T_2$) at the same time, is the solution of the function. Because L(r) is monotone, there is at most one crossover point, which means that the formula (4) has at most one solution.

Therefore, the formula (4) has only one solution.

The formula (4) is a transcendental equation, and it is difficult to obtain a analytical solution. However, since the formula (4) has only one solution, a numerical solution satisfying an engineering accuracy requirement is obtained by iteration.

The formula (4) is calculated by a least square method comprising steps of:

$$\min:(U_1-U_1(L,r))^2+(U_2-U_2(L,r))^2$$

s.t.1:r>0 s.t.2:L>0 (6)

further obtaining:

$$\min\left(U_1(R+r) - U_{max}\left(r + R \times e^{-\frac{R+r}{K} \times T_1}\right)\right)^2 + \\ \left(U_2(R+r) - U_{max}\left(r + R \times e^{-\frac{R+r}{L} \times T_2}\right)\right)^2 \quad (7)$$

s.t.1:r > 0 s.t.2:L > 0 and applying each of the sample values in the [$U_1$, $U_2$] for respectively calculating and obtaining the numerical solution of the [L, r] corresponding to the [$U_1$, $U_2$], in such a manner that the look-up table is obtained. In practice, the value of L is obtained with $U_1$ and $U_2$, so as to define a state of the IPS.

Look-up Table Compression:

For example, in a 12-bit ADC, a size of a complete 2-dimensional look-up table is $2^{12} \times 2^{12}$, and a storage volume thereof is 16M units, which means poor practicability. An effective method for compressing the look-up table must be found for ensuring practicability of the present invention. By taking full advantage of a distribution characteristic of sample values [$U_1$, $U_2$] in a real circuit, the look-up table is able to be effectively compressed.

With given (rx, Lx), the only ($U_1$x, $U_2$x) is calculated and obtained by the formula (7). Theoretically, there are and only one solution, but the solution is restricted by conditions such as physical models and $T_1 < T_2$.

U(T) is a monotone decreasing function. If $T_1 < T_2$, then $U_1 > U_2$. Supposing that $U_1 < U_2$, the solution of the function should at least comprise a negative number for changing monotone, which is physically unreasonable.

After the formula (5) is converted to an inverse function of U about L:

$$\frac{1}{L} = -\frac{\log\left[\frac{U}{4096R}(R+r) - \frac{r}{R}\right]}{(R+r) \times T} \quad (8)$$

Therefore, L may be a complex number, unless:

$$\left[\frac{U}{4096R}(R+r)-\frac{r}{R}\right]>0 \quad (9)$$

which means:

$$U>\frac{4096r}{R+r} \quad (10)$$

If $(U_1x, U_2x)$ is improperly given, $(rx, Lx)$ obtained may comprise a negative or even complex number. In fact, physically sampled $(U_1, U_2)$ is certainly reasonable. A restriction relationship exists between $U_1$ and $U_2$, in such a manner that $(r, L)$ belongs to a positive real domain. That is to say, a crossover point of the two curves in the FIG. 10 is at a first quadrant of a positive real domain coordinate. $(U_1, U_2)$ out of the restriction will not be obtained in the practical sampling, and do not need to be recorded.

With the sample values $(U_1, T_1)$ and $(U_2, T_2)$, it is obtained that:

$$\begin{cases} L=-\dfrac{(R+r)\times T_1}{\log\left[\dfrac{U_1}{4096R}(R+r)-\dfrac{r}{R}\right]} \\ L=-\dfrac{(R+r)\times T_2}{\log\left[\dfrac{U_2}{4096R}(R+r)-\dfrac{r}{R}\right]} \end{cases} \quad (11)$$

then obtaining $$\left[\frac{U_1}{4096R}(R+r)-\frac{r}{R}\right]^{\left(\frac{T_2}{T_1}\right)}=\left[\frac{U_2}{4096R}(R+r)-\frac{r}{R}\right] \quad (12)$$

If a set of $(U_1, U_2)$ satisfies both the formulas (10) and (12), the function has a positive real number solution.

According to the formula (12), the given $U_1$ and r should satisfy a condition of:

$$r\geq\frac{U_1R}{U_1-4096} \quad (13)$$

wherein $r_{min}$ is able to be determined.

Figure 11:
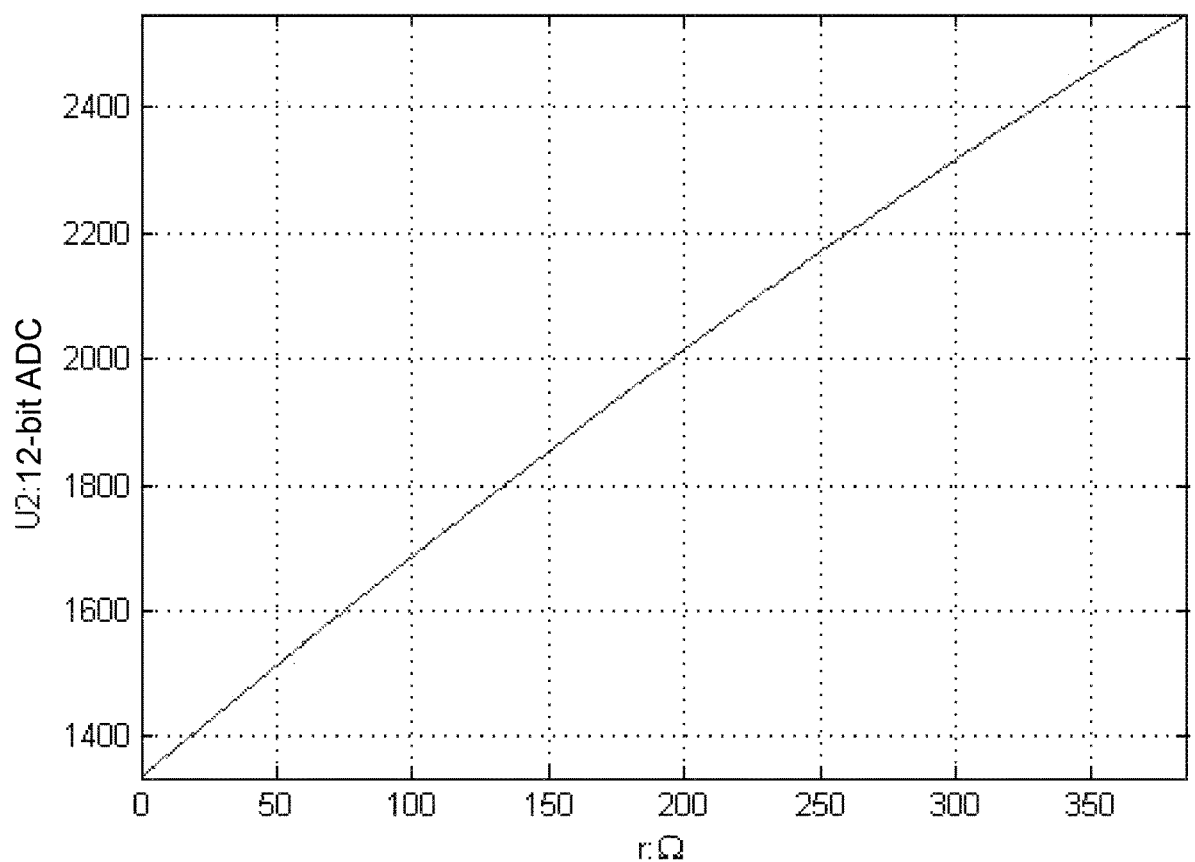
FIG. 11 shows a restriction condition of r-$U_2$ according to the preferred embodiment of the present invention.

After determining the $U_1$, a restriction relationship of $U_2(r)$ is obtained, as illustrated in the FIG. 11.

Figure 12:
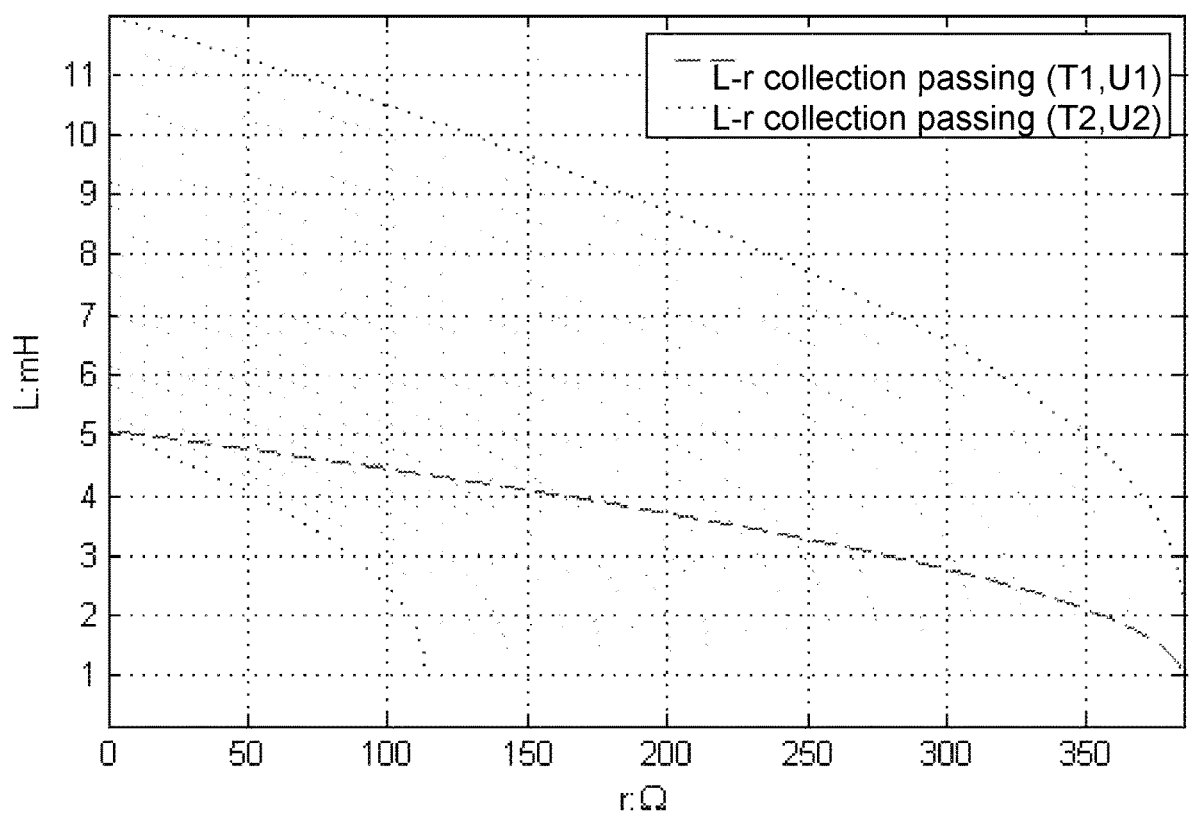
FIG. 12 shows a cluster of curves of $U_2$ which have positive real crossover points with a given curve of $U_1$ according to the preferred embodiment of the present invention.

$U_2(r)$ is a monotone function, a range thereof is determined by the definition domain of the r. $U_2$ within the range and the given $U_1$ both enable a positive real number solution of the function, which is illustrated in the FIG. 12.

Figure 13:
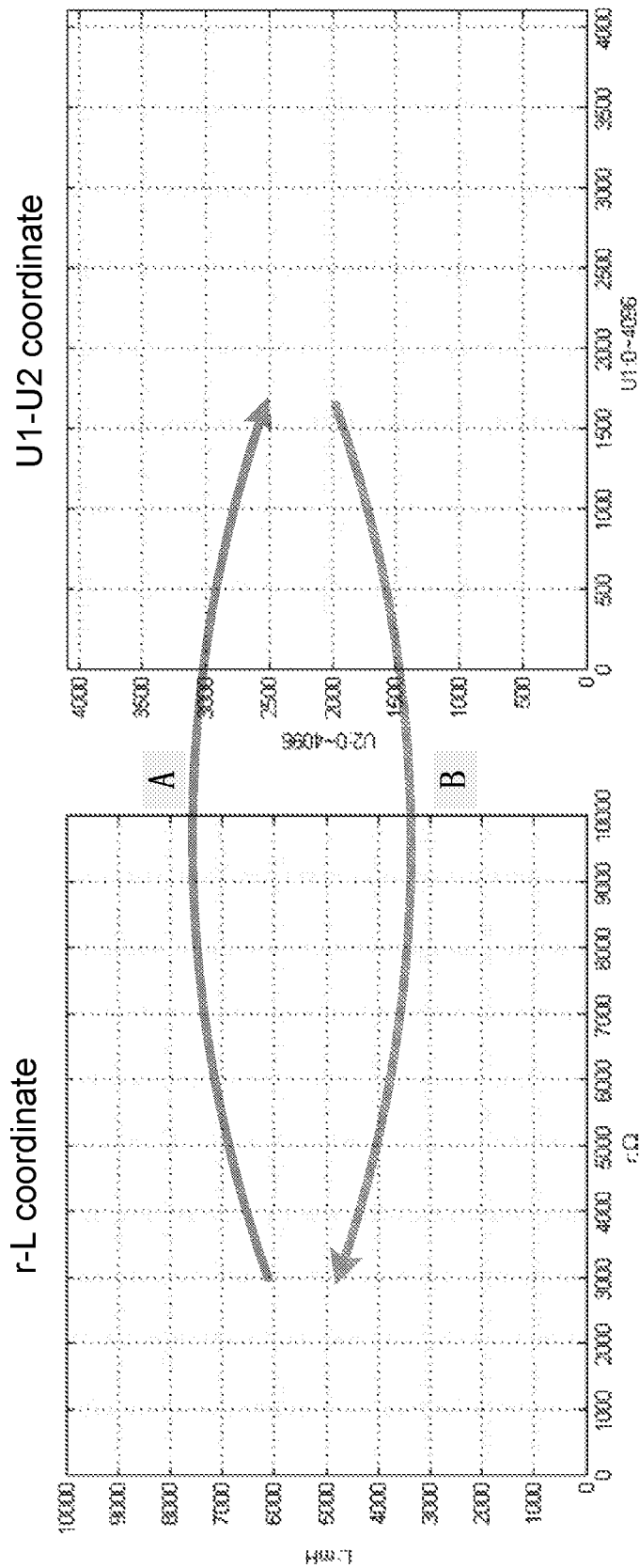
FIG. 13 shows coordinate mapping according to the preferred embodiment of the present invention.

Referring to the FIG. 13, essence of look-up calculation is mapping the $U_1$-$U_2$ coordinate to the r-L coordinate.

Process A is a physical sampling process. Every point in the r-L coordinate is able to be mapped to the $U_1$-$U_2$ coordinate.

Process B is a look-up calculation process. Some points in the $U_1$-$U_2$ coordinate are able to be mapped back to the r-L coordinate. Some points in the $U_1$-$U_2$ coordinate will fall in other quadrants (negative number) or a 4-dimensional complex space when being mapped to the r-L coordinate.

Figure 14:
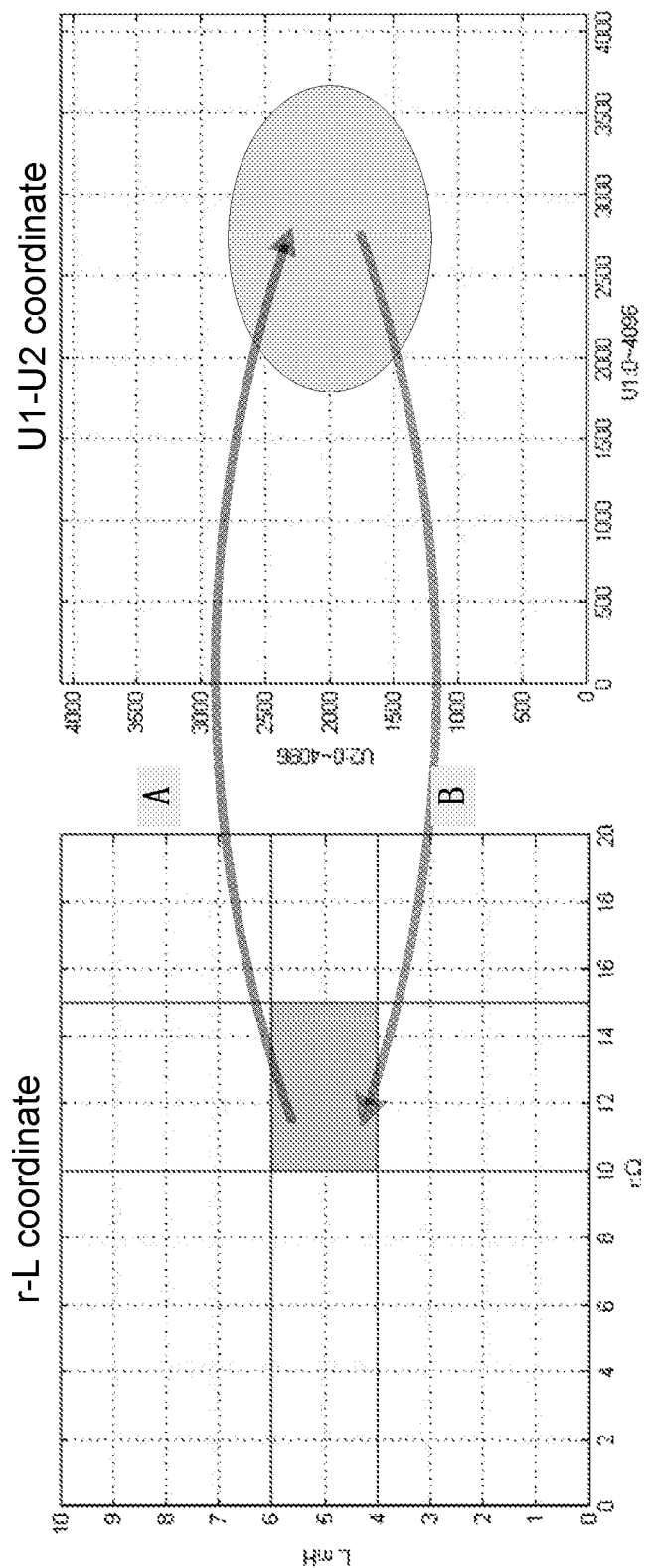
FIG. 14 shows coordinate mapping according to the preferred embodiment of the present invention.

The r is $[10, 15]\Omega$, the L is $[4.5, 5.5]$ mH; mapping relationship thereof is illustrated in the FIG. 14.

A range of $U_1$ is determined by the formula (13). With each given $U_1$, a range of $U_2$ corresponding to the r within a physical changing range is able to be obtained by the restriction relationship of the formula (12). The range of $U_2$ is obtained in sequence, and a shadow area in the $U_1$-$U_2$ coordinate in the FIG. 14 is determined for obtaining the FIG. 15.

A quantity of units of the look-up table is decreased from 4096*4096 to 9360, which means the look-up table is compressed by 1792 times.

Figure 15:
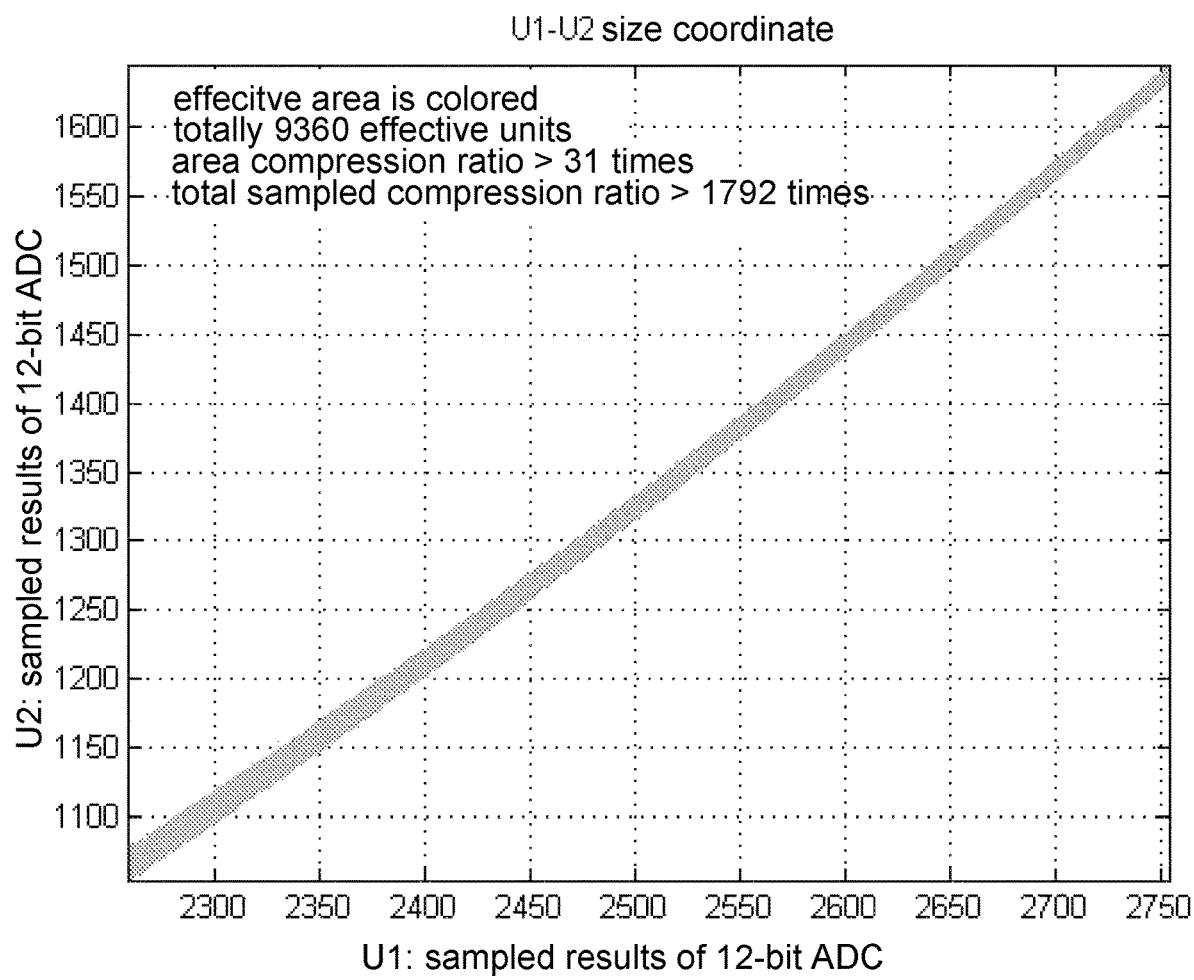
FIG. 15 shows an effective table area according to the preferred embodiment of the present invention.
Figure 16:
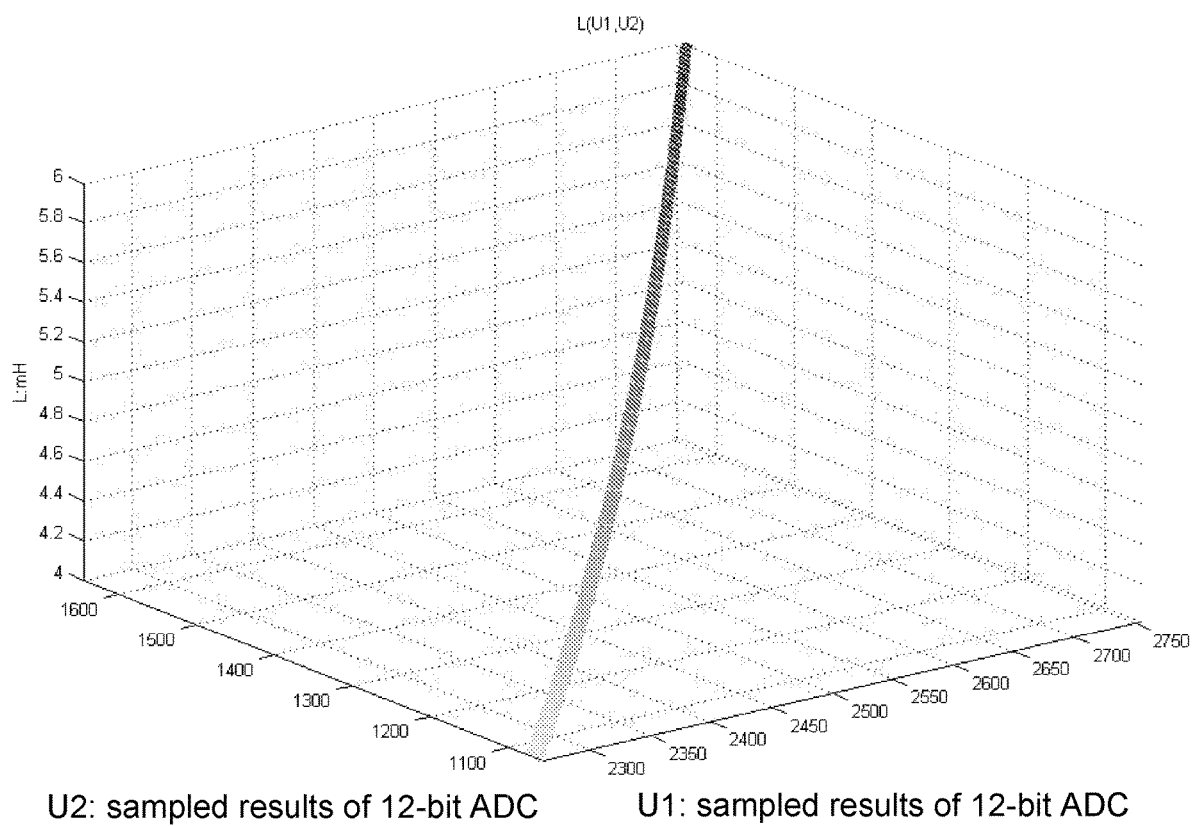
FIG. 16 shows a solution of a function $L(U_1, U_2)$ within an effective definition domain according to the preferred embodiment of the present invention.

Beneficial Effects:

According to the definition domain of $(U_1, U_2)$ in the FIG. 15, the corresponding L is obtained in sequence by the formula (4), and the look-up table is built. Regarding L as a Z axis, an image of the function $L(U_1, U_2)$ within the definition domain is obtained, as shown in the FIG. 16.

After ergodic, a max quantization error of L during looking up is 6.30153 uH, at $U_1$=2754 and $U_2$=1644.

It is illustrated that with a 12-bit ADC, measurement accuracy is up to 1%. L is [4.5, 5.5] mH, wherein at least 33 levels of effective resolutions are able to be obtained.

According to the theory of the present invention, driving and detection systems for non-contact IPSs are developed. According to tests, a total measurement error of the system is lower than 1% at a temperature between −55° C. and 125° C.; all detection and calculation are directly processed by a logic device, wherein hardware such as CPU and DSP is not utilized. And the detection and calculation are realized by looking up a 10K look-up table. At the same time, the system has been in accordance with standards of MIL-STD-461F for providing CS114, RE102, and RS103 tests. Results thereof satisfy MIL-STD-461F requirements.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A measurement method for measuring an induction of an aviation-specific inductive proximity sensor (IPS), comprising steps of:
   1) building a measurement circuit, wherein the IPS comprises an internal resistance r and an inductance L, a value of the internal resistance r increases when environmental temperature increases, a value of the inductance L relates to a distance of the IPS; the measurement circuit of the IPS comprises a current-limiting resistance R, the IPS and a controlled switch connected in series: an analog digital converter (ADC) is placed at a voltage measurement node between the current-limiting resistance R and the internal resistance r; at a time $T_0$, when the controlled switch is off, the inductance L is charged, a field programmable gate array (FPGA) drives the measurement circuit, when the controlled switch is on, the inductance L slowly discharges through the internal resistance r and the current-limiting resistance, a first constant delay time $T_1$ and a second constant delay time $T_2$ control the ADC to sample; and 2) building a look-up table comprising steps of: sampling a first voltage measured value $U(T_1)$ which is a sampling voltage at the voltage measurement node corresponding to the first constant delay time $T_1$ with the ADC; sampling a second voltage measured value $U(T_2)$ which is a sampling voltage at the voltage measurement node corresponding to the second constant delay time $T_2$ with the ADC;

using voltage discharge formulas $U(T_1)$ and $U(T_2)$ of an r-L circuit for solving L and r:

$$\begin{cases} U_1 = \frac{U_{max}}{R+r}\left[r + R \times e^{-\frac{R+r}{L} \times T_1}\right] \\ U_2 = \frac{U_{max}}{R+r}\left[r + R \times e^{-\frac{R+r}{L} \times T_2}\right] \end{cases} \quad (4)$$

wherein $T_1$, $T_2$, $U_{max}$, and R are constants; L and r are independent variables, in the two formulas for solving [L, r] corresponding to sample values [$U(T_1)$, $U(T_2)$], wherein $U_{max}$ is equal to $2^n-1$, n is a resolution of the ADC, then building the look-up table of the internal resistance r and the inductance L corresponding to the sample values [$U(T_1)$, $U(T_2)$].

2. The measurement method, as recited in claim 1, wherein in the step 2), between the first constant delay time $T_1$ and the second constant delay time $T_2$, the controlled switch is off which deactivates the measurement circuit, the inductance L slowly discharges; at an initial time $T_0$, the controlled switch is on which activates the measurement circuit, then the inductance L is charged, and a current thereof is:

$$i = \frac{U_{max}}{R+r}\left[1 - e^{-\frac{R+r}{L} \times T}\right] \quad (1)$$

a voltage at the voltage measurement node is:

$$U(T) = U_{max} - i \times R \quad (2)$$

therefore:

$$U(T) = \frac{U_{max}}{R+r}\left[r + R \times e^{-\frac{R+r}{L} \times T}\right] \quad (3)$$

the first constant delay time $T_1$ and the second constant delay $T_2$ control the ADC to sample voltage at the voltage measurement node, $U(T)$ is a monotone decreasing function, if $T_1 < T_2$, then $U(T_1) > U(T_2)$, the values of the internal resistance r and the inductance L are calculated.

3. The measurement method, as recited in claim 2, wherein based on a fact that the formula (4) has only one solution [L, r] with given sample values [$U(T_1)$, $U(T_2)$], the solution is obtained by a least square method comprising steps of:

building an object function:

$$\min:(U(T_1)-U(L,r,T_1))^2 + (U(T_2)-U(L,r,T_2))^2$$

$$s.t.1: r > 0$$

$$s.t.2: L > 0 \quad (5)$$

further obtaining:

$$\min\left(U_1(R+r) - U_{max}\left(r + R \times e^{-\frac{R+r}{L} \times T_1}\right)\right)^2 + \left(U_2(R+r) - U_{max}\left(r + R \times e^{-\frac{R+r}{L} \times T_2}\right)\right)^2 \quad (6)$$

$$s.t.1: r > 0$$

$$s.t.2: L > 0$$

and applying each of the sample values in the [$U(T_1)$, $U(T_2)$] for respectively calculating and obtaining a numerical solution of the [L, r] corresponding to the [$U(T_1)$, $U(T_2)$], in such a manner that the look-up table is obtained.

* * * * *